US005537078A

United States Patent [19]

Strong

[11] Patent Number: 5,537,078
[45] Date of Patent: Jul. 16, 1996

[54] OPERATIONAL AMPLIFIER WITH JFET INPUTS HAVING LOW INPUT BIAS CURRENT AND METHODS FOR USING SAME

[75] Inventor: Alexander M. Strong, San Jose, Calif.

[73] Assignee: Linear Technology Corporation, Milpitas, Calif.

[21] Appl. No.: 414,622

[22] Filed: Mar. 31, 1995

[51] Int. Cl.[6] .................................................. H03F 3/45
[52] U.S. Cl. ............................................ 330/253; 330/260
[58] Field of Search ............................. 330/85, 253, 260, 330/261, 277

[56] References Cited

U.S. PATENT DOCUMENTS 4,044,313  8/1977  Wittlinger et al. ............... 330/260 X
4,639,683  1/1987  Counts et al. ..................... 330/253

Primary Examiner—Steven Mottola
Attorney, Agent, or Firm—Fish & Neave; Jonathan T. Kaplan; Robert W. Morris

[57] ABSTRACT

This invention relates to operational amplifiers (opamps) which use junction field effect transistors (JFETs) for the differential input pair to achieve a low input bias current. More particularly, the present invention relates to opamps wherein each input of the opamp drives directly only one gate of its corresponding JFET to further reduce the input bias current. In one embodiment of the present invention, the bottom gate of each JFET of the differential input pair is directly coupled to the common source node of the differential input pair. In another embodiment of the present invention, the bottom gate of each JFET of the differential input pair is directly coupled to the common source node and a resistor is coupled in series with the top gate of each JFET. In the preferred embodiment of the present invention, the bottom gate of each JFET of the differential input pair is coupled to the common source node through a resistor.

24 Claims, 9 Drawing Sheets

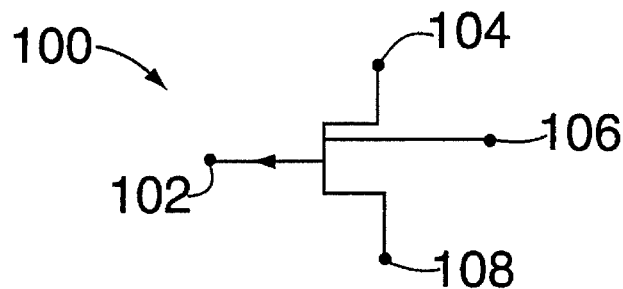
FIG. 1A, PRIOR ART
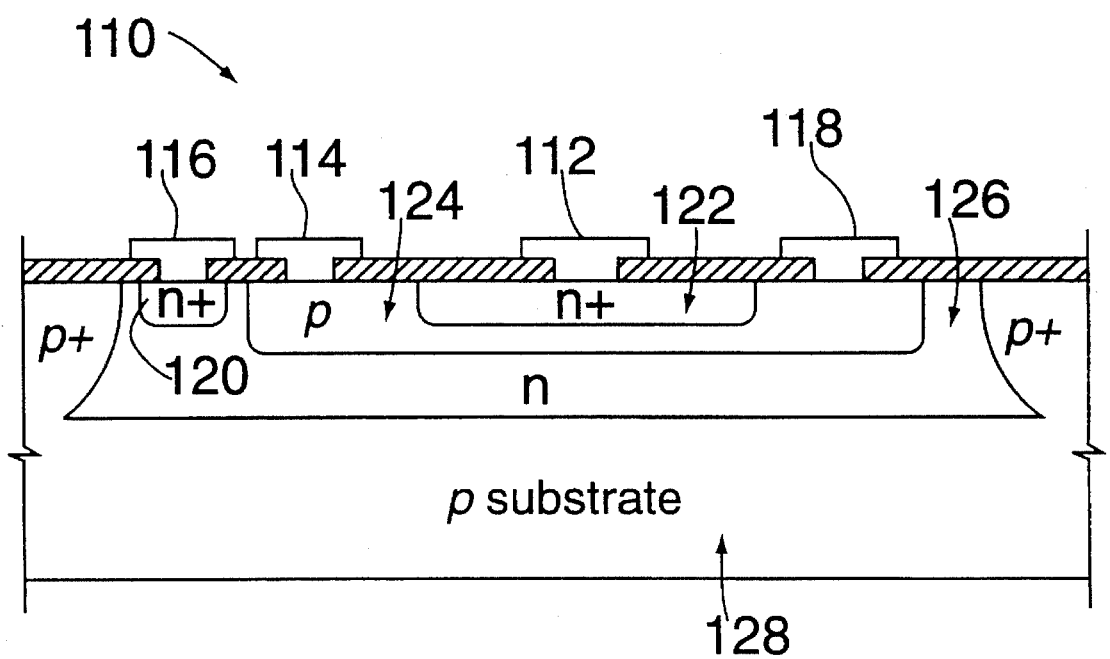
FIG. 1B, PRIOR ART

| CONFIGURATION | $I_D$ | $I_{DSS}$ | $V_P$ | $\beta$ | $g_m$ |
|---|---|---|---|---|---|
| FIG. 7A | 400µA | 480µA | 0.71V | 952 $\frac{\mu A}{V^2}$ | 1.23 mmho |
| FIG. 7B | 400µA | 480µA | 0.90V | 593 $\frac{\mu A}{V^2}$ | 0.97 mmho |
| FIG. 7C | 400µA | 480µA | 3.93V | 31 $\frac{\mu A}{V^2}$ | 0.22 mmho |

OPERATIONAL AMPLIFIER WITH JFET INPUTS HAVING LOW INPUT BIAS CURRENT AND METHODS FOR USING SAME

This invention relates to operational amplifiers (opamps) which use junction field effect transistors (JFETs) for the differential input pair to achieve a low input bias current. More particularly, the present invention relates to opamps wherein each input of the opamp drives directly only one gate of its corresponding JFET to further reduce the input bias current.

BACKGROUND OF THE INVENTION

JFETs are known to be desireable differential input pair transistors for opamps, compared with bipolar junction transistors (BJTs), because of their low input bias current and high AC performance. A known disadvantage of JFET inputs, compared with BJTs, is a high voltage noise (wherein voltage noise is measured in units of nanovolts (nV) per root Hertz (rtHz)).

JFET transistors are of two main types: P-channel (PJFET) and N-channel (NJFET). For illustrative purposes, a schematic symbol for a P-channel JFET 100 is shown in FIG. 1A. The P-channel of JFET 100, which consists of a semiconductor material which has been doped to contain an excess of holes, is between terminals 104 and 108. Of these two terminals, the terminal supplying the majority carrier of the channel (which is the more positive terminal for a P-channel device) is designated the source (S) while the other terminal is designated the drain (D). Between the source and drain of JFET 100's P-channel are two gates which are referred to as the top gate and the bottom gate. Each gate comprises a region of the P-channel which has been doped to contain an excess of electrons. The top gate is represented by terminal 102 while the bottom gate is represented by terminal 106.

The low input bias current of JFETs is due to the fact that, in normal operation, the gates control the flow of current between the source and drain by generating an electric field in the channel. This field is produced by applying a gate-to-source voltage between each gate and the channel which keeps the PN junctions reverse biased. The only current flow, and therefore the only input bias current, through the gates of a JFET during normal operation is due to leakage current.

For illustrative purposes, FIG. 1B depicts a known integrated circuit PJFET structure formed in a P-substrate 128. The P-channel 124 couples together terminals 114 and 118. The top gate is formed by terminal 112 and $N^+$ region 122, while the bottom gate is formed by terminal 116, $N^+$ region 120 and N region 126.

Desireable JFET characteristics may be utilized in opamps through known techniques of constructing the differential input pair from JFETs and coupling the respective inputs of the opamp to both the top gate and bottom gate of the corresponding differential input.

It would be desireable to further reduce the input bias current of a JFET opamp to provide circuit performance which approaches that of an ideal opamp requiring zero input bias current.

Typical techniques for reducing a JFET's input bias current (including the present invention) utilize the essential technique of decoupling the bottom gate of each JFET so that only the top gate is directly driven by the opamp's differential input. These techniques differ only in the means by which they drive the decoupled bottom gate. Directly driving only the top gate will also reduce the opamp's input capacitance. It is desireable to further reduce the input capacitance of an opamp because this approaches an ideal opamp which would have zero input capacitance. These reductions in input bias current and input capacitance are due, respectively, to the elimination of the bottom gate's leakage current and capacitance.

In typical integrated circuit JFETs the bottom gate's leakage current and capacitance are substantially higher than for the top gate. The differences in the physical structure of the top gate and bottom gate, which produce their differing electrical characteristics, are also illustrated by FIG. 1B. The $N^+$ region 122, which forms the top gate, is substantially smaller than N region 126 which forms the bottom gate. Directly driving only the top gate 122 will substantially lower the input bias current (typically by about one order of magnitude) since the PN junction between top gate 122 and P-channel 124 is substantially smaller than the PN junction between bottom gate 126 and P-channel 124. In addition, directly driving only the top gate will substantially reduce the input capacitance since the capacitance of top gate 122 is substantially smaller than the capacitance of bottom gate 126.

The circuit which drives the bottom gate must track the voltage of the top gate to prevent a problem with JFETs known as "punch through." Punch through, which is defined as conduction produced by a breakdown between the top gate and bottom gate, occurs when the top gate's voltage differs from the bottom gate's voltage by a relatively small amount (typically 4 to 5 volts) causing the normally reverse biased PN junctions between the top gate and bottom gate to break down. This problem cannot be solved by tying the bottom gate to a fixed voltage because this would severely limit the input voltage range of the opamp.

One known technique for driving the bottom gate, for each differential JFET input of an opamp, is to have a voltage follower circuit connected between each opamp input and the bottom gate of its differential input JFET. The voltage followers address punch through by keeping each bottom gate voltage the same as its corresponding top gate voltage. However, the addition of voltage follower circuits introduce several deficiencies. First, punch through can still occur if the slew rate of either follower circuit is exceeded. Secondly, the follower circuits add their own input bias currents to that of the JFET. Thirdly, the follower circuits add their own power requirements to those of the opamp. Finally, the follower circuits require significant additional circuitry thereby increasing die size and reducing reliability.

In view of the foregoing, it would be desirable to provide an improved circuit for driving the bottom gate of a JFET.

It would also be desirable to limit the extent to which a punch through current, through one of the opamp's inputs, effects the signal source driving the other input opamp input.

SUMMARY OF THE INVENTION

In view of the foregoing, it is an object of the present invention to provide an improved bottom gate driving circuit.

It is also an object of the present invention to limit the extent to which a punch through current, through one of the opamp's inputs, effects the signal source driving the other input opamp input.

These, and other objects of the present invention, are accomplished by coupling the bottom gate of each JFET, of a differential input pair, to the differential input pair's common source node.

In one embodiment of the present invention, the bottom gate of each JFET is directly coupled to the common source node. This embodiment exhibits a punch through current ($I_{dpt}$) when the inputs differ by at least a certain voltage which is referred to as $V_{dpt}$. However, in certain situations, a sufficiently large $I_{dpt}$ is produced which may degrade both static and dynamic operation of the opamp.

In another embodiment of the present invention, the bottom gate of each JFET is directly coupled to the common source node and a resistor is coupled in series with the top gate of each JFET. The resistor is chosen to limit $I_{dpt}$ to an acceptable range and to increase the resistance of the current path which may be formed between the opamp's inputs. The voltage noise of the resistors, however, may be directly added to the voltage noise of the JFETs and thereby increasing the voltage noise of the overall opamp.

In the preferred embodiment of the present invention, the bottom gate of each JFET is coupled to the common source node through a resistor. The resistor is chosen to limit $I_{dpt}$ to an acceptable range and to increase the resistance of the current path which may be formed between the opamp's inputs. With regard to voltage noise (because the resistors are connected in series with the bottom gates as opposed to being connected in series with the top gates as described in the above embodiment of the present invention), to the extent that the $g_m$ of the bottom gate is less than the $g_m$ of the top gate, the voltage noise added by the resistor to the opamp's input is attenuated.

The $g_m$ (or transconductance) of a JFET is defined by the following formula:

$$g_m = \frac{\Delta I_D}{\Delta V_{GS}} \quad (1)$$

Where $\Delta I_D$ is the change in drain current which occurs in response to a change in the gate to source voltage ($\Delta V_{GS}$). With current being measured in units of amperes (A) and voltage being measured in units of volts (V).

The transfer characteristic of a JFET is the relationship between the drain current ($I_D$) and the gate to the source voltage ($V_{GS}$) for a fixed drain to source voltage ($V_{DS}$).

While the $g_m$ is a linear function, the actual transfer characteristic of a JFET is nonlinear. The $g_m$ is the slope of the actual transfer characteristic at a quiescent point. The quiescent point is a point on the actual transfer characteristic about which small signal variations occur.

Since a particular value of $g_m$ is accurate only for small variations about the quiescent point for which it is calculated, the $g_m$ is also called the "small signal" gain of a JFET.

The large signal gain ($\beta$) of a JFET can be described by the following formula:

$$\beta = \frac{I_{DSS}}{V_p^2} \quad (2)$$

$I_{DSS}$ is defined as the saturation current, between the drain and source of a JFET, when $V_{GS}$ is zero. $V_p$ (also called the "pinch off" voltage) is the extrapolated minimum gate to source voltage which would cause no current to flow between the source and drain.

The $g_m$, for a particular quiescent point value of $I_D$, is calculated from B with the following formula:

$$g_m = 2 \cdot (I_D \sqrt{\beta})^{1/2} \quad (3)$$

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which:

FIG. 1A is a schematic diagram showing a conventional P-channel JFET (PJFET);

FIG. 1B is a cross-sectional view of a conventional integrated circuit structure for a P-channel JFET (PJFET);

FIG. 8 depicts a table of circuit measurements and of PJFET characteristics calculated from the measurements.

DETAILED DESCRIPTION OF THE INVENTION

Figure 2:
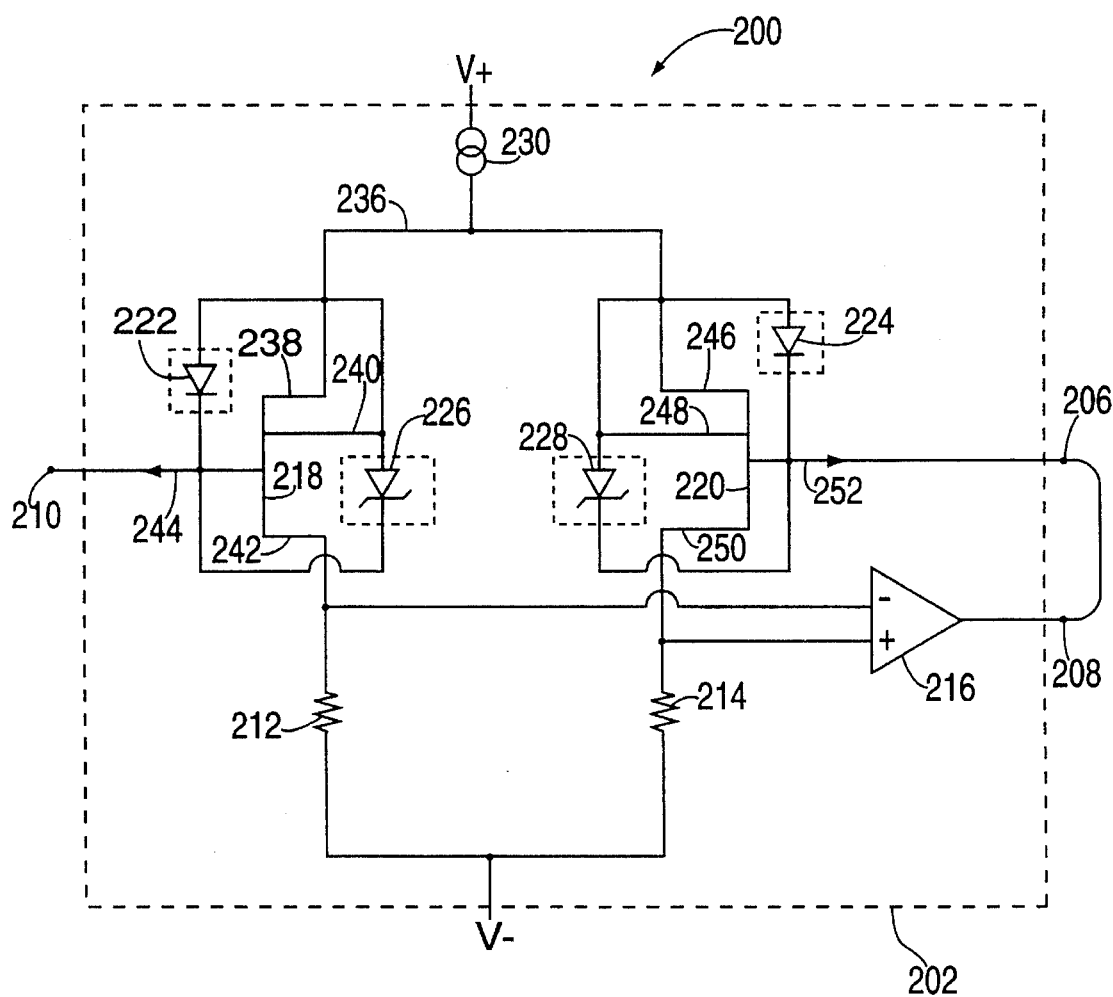
FIG. 2 is a schematic diagram of an operational amplifier, connected in a unity gain follower configuration, which incorporates the principles of the present invention.

FIG. 2 depicts one embodiment of a generic opamp 202 which, in accordance with the principles of one embodiment of the present invention, has the bottom gates of the differential input pair directly coupled to the common source node. Opamp 202 is wired into unity gain configuration 200 by connecting output 208 to negative input 206. Second stage amplifier 216 drives output 208 of opamp 202. The negative input of second stage amplifier 216 is driven by the voltage drop produced across balancing resistor 212, while the positive input of second stage amplifier 216 is driven by the voltage drop produced across balancing resistor 214.

The differential input pair of opamp 202 is formed by PJFETs 218 and 220. JFET 218 includes source 238, drain 242, top gate 244 and bottom gate 240. JFET 220 comprises source 246, drain 250, top gate 252 and bottom gate 248. Top gates 244 and 252 form, respectively, opamp 202's positive input 210 and negative input 206. The sources of JFETs 218 and 220 are commonly connected to common source node 236. Current is supplied to the differential input pair by current source 230 (this current is commonly referred to as "tail current"). As can be seen from FIG. 2, the bottom gates 240 and 248, of JFETs 218 and 220, are also connected to common source node 236. The parasitic diodes of JFETs 218 and 220, which do not normally affect the operation of the JFETs, are represented by diodes 222 to 228. Diodes 222 to 228 are enclosed in dashed boxes to indicate that rather than being separate components, they represent the PN junctions of JFETs 218 and 220. Diodes 222 and 224 represent the forward biasing of the top gate to source junctions for, respectively, JFETs 218 and 220. Zener diodes 226 and 228 represent the top gate to bottom gate punch through of, respectively, JFETs 218 and 220.

Figure 5:
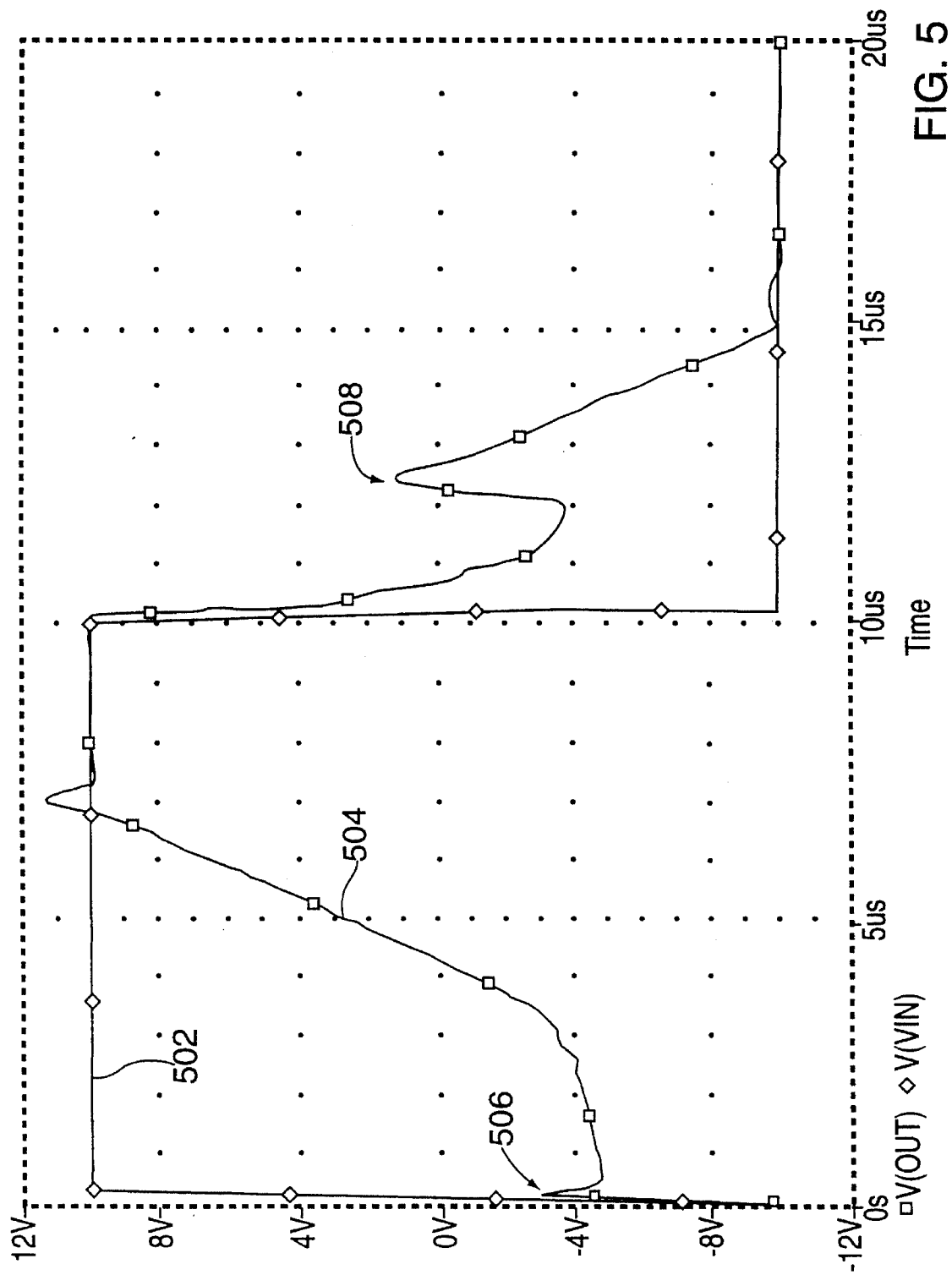
FIG. 5 is a graph which shows the results of a simulation of the unity gain follower circuit of FIG. 2.

For the purposes of the simulation depicted in FIG. 5, opamp 202 has been wired into unity gain configuration 200, in order to measure its slewing rate. The unity gain configuration is achieved by connecting output 208 of the opamp to negative input 206. Unity gain configuration 200 is a typical example of where the present invention can be applied since it is a circuit configuration characterized by wide voltage differences between its two inputs 210 and 206, such voltage difference often being of at least $V_{dpt}$ in magnitude, when the voltage applied at input 210 changes.

While opamp 202 has reduced input bias current and capacitance, as explained below, there is a punch through current ($I_{dpt}$) through either JFET 218 or 220 when the inputs differ by at least a certain voltage ($V_{dpt}$).

The behavior of opamp 202, when the difference between inputs 206 and 210 differ by at least $V_{dpt}$, is now described.

Firstly, the invention is characterized, in general, according to its initial dynamic response to an input change and its secondary dynamic response. Secondly, two specific examples of the initial and secondary dynamic responses of opamp 202, when wired as unity gain follower 200, are presented.

Understanding the operation of the invention is aided by knowing the state of the source to drain path of a JFET under two non-normal conditions. First, when conduction occurs between the top gate and the bottom gate of a JFET because of punch through, the source to drain path is fully off. Second, when the PN junction between the source and the top gate of a JFET is forward biased, the source to drain path is fully on.

The following dynamic characterization assumes, for the purposes of illustration, that initially the circuit has had time to settle into a static mode of operation with the voltage between positive input 210 and negative input 206 being less than $V_{dpt}$. One of the inputs then changes its voltage such that the voltage across the inputs differ by at least $V_{dpt}$.

The initial dynamic response assumes, for the purposes of illustration, that the changed input's voltage has changed sufficiently quickly such that after the input's voltage has changed, the common source node has remained at substantially the same voltage it had prior to the input's voltage change. The secondary dynamic response occurs when the common source node has had sufficient time to change its voltage, in response to the changed input, such that (i) one of the JFETs 218 or 220 has punched through, and (ii) the current path between the inputs of opamp 202, if it is to be formed, has been formed.

Even after opamp 202 has had its secondary dynamic response, it is typically the case that the output of opamp 202 has still not substantially changed from its previous voltage level. This is due to the fact that the output of opamp 202 will only change when second stage amplifier 216 has also had sufficient time to respond to the changed input.

The initial dynamic response of opamp 202 depends only upon the relative change of the changed input. There are two ways in which the changing input's voltage can change to yield a difference across the two inputs 206 and 210 which is at least $V_{dpt}$: (i) the changing input's voltage can drop, or (ii) the changing input's voltage can rise.

The invention's initial dynamic response to a drop of the changing input's voltage is as follows. The JFET whose input has changed to a lower voltage level is referred to as the low-input JFET. The JFET whose input has remained at a higher voltage level is referred to as the high-input JFET. The low-input JFET becomes forward biased between its source and top gate. The high-input JFET does not punch through.

Some time after the changing input's voltage has dropped the following secondary dynamic response occurs. The low-input JFET pulls the voltage of the common source node low enough such that the high-input JFET punches through. The low-input JFET may pull the common source node low enough such that the low-input JFET is no longer forward biased.

The invention's initial dynamic response to an increase of the changing input's voltage is as follows. The JFET whose input has changed to a higher voltage level is referred to as the high-input JFET. The JFET whose input has remained at a lower voltage level is referred to as the low-input JFET. The low-input JFET does not become forward biased between its source and top gate. The high-input JFET punches through.

Some time after the changing input's voltage has increased the following secondary dynamic response occurs. The high-input JFET may pull the voltage of the common source node high enough such that the low-input JFET is forward biased.

The secondary dynamic response of the invention can be characterized into two major types of responses depending upon whether the source to top gate of the low-input JFET is forward biased.

In both types of secondary dynamic responses, there is a punch through current ($I_{dpt}$) from the top gate to the bottom gate of the high-input JFET. All other circuit factors being kept within certain ranges (including the opamp circuitry as well as its operating environment), the internal resistance of the signal source ($S_{high}$) input to the high-input JFET determines the maximum magnitude of $I_{dpt}$. (The signal source input to the low-input JFET is called $S_{low}$). The maximum magnitude of $I_{dpt}$ determines whether a sufficient voltage drop develops across the source to top gate of the low-input JFET such that the source to top gate of the low-input JFET forward biases.

Whether the source to top gate of the low-input JFET is forward biased is an important consideration since, coupled with the punch through of the high-input JFET, it determines whether a low resistance path is formed between the two inputs of the opamp. A maximum magnitude of $I_{dpt}$ in a range sufficient to forward bias the low-input JFET is called $I_{dpt1}$, while the range of maximum $I_{dpt}$ currents too small to forward bias the low-input JFET is called $I_{dpts}$.

Depending upon the internal resistances of $S_{high}$ and $S_{low}$, the formation of a low resistance path between the opamp's inputs may cause substantial currents to be drawn from the signal sources. In the case of a unity gain follower, the existence of a low resistance path between the inputs, before the output of the follower has had time to substantially change, means that the input signal (assuming it is provided by a low internal resistance source) supplies or sinks large amounts of current as it attempts to "drag" the output of the follower to its new value.

$I_{dpt}$ also raises the current through the balancing resistor of the low-input JFET. If the low-input JFET is 218, then $I_{dpt}$ raises the current through its balancing resistor 212. If the low-input JFET is 220, than $I_{dpt}$ raises the current through its balancing resistor 214. Increased current through a balancing resistor causes it to apply a greater voltage to second stage amplifier 216 of the opamp.

Unless the maximum magnitude of $I_{dpt}$ is sufficiently limited, $I_{dpt}$ may raise the voltage applied to the second stage amplifier 216 of the opamp, by the balancing resistor, to an unacceptably high level.

A specific example of the initial and secondary dynamic responses of opamp 202, wired as unity gain follower 200, is now described. To distinguish this example from the general discussion presented above, values have been given an "example1" suffix. This example assumes that input 210's voltage has increased such that the difference between inputs 210 and 206 is at least $V_{dpt}$.

According to the above presented definitions, JFET 218 is the high-input JFET while JFET 220 is the low-input JFET. The initial dynamic response is as follows: JFET 220 is not forward biased between its source and top gate, and JFET 218 punches through.

According to the above general discussion, the specific secondary dynamic response of opamp 202 is as follows.

JFET 218 has a punch through current $I_{dpt\_example1}$ from its top gate to bottom gate. The internal resistance of the signal source ($S_{high\_example1}$) input to the top gate of JFET 218 determines the maximum magnitude of $I_{dpt\_example1}$. As discussed above, the maximum magnitude of $I_{dpt\_example1}$ determines whether the source to top gate of JFET 220 forward biases and forms a low resistance path between inputs 210 and 206.

In this specific example with unity gain follower 200, a low resistance path, before output 208 has had time to equalize its voltage with input 210, means that $S_{high\_example1}$ (provided $S_{high\_example1}$ has a low internal resistance) will source large amounts of current as it attempts to "drag" output 208 to its new value through the path formed between inputs 210 and 206.

$I_{dpt\_example1}$ also raises the current through balancing resistor 214 of JFET 220. Unless the maximum magnitude of $I_{dpt\_example1}$ is sufficiently limited, it may cause resistor 214 to supply an unacceptably high voltage to the positive input of second stage amplifier 216.

A second specific example of the initial and secondary dynamic responses of opamp 202, wired as unity gain follower 200, is now described. To distinguish this example from the discussions presented above, values have been given an "example2" suffix. This example assumes that input 210's voltage has decreased such that the difference between inputs 210 and 206 is at least $V_{dpt}$.

According to the above presented definitions, JFET 218 is the low-input JFET while JFET 220 is the high-input JFET. The initial dynamic response is as follows: JFET 220 does not punch through, and JFET 218 is forward biased between its source and top gate.

According to the above general discussion, the specific secondary dynamic response of opamp 202 is as follows.

JFET 220 has a punch through current $I_{dpt\_example2}$ from its top gate to bottom gate once JFET 218 has pulled the voltage of common source node 236 low enough. The internal resistance of the signal source ($S_{high\_example2}$) input to the top gate of JFET 220 determines the maximum magnitude of $I_{dpt\_example2}$. In the case of unity gain follower 200, $S_{high\_example2}$ is the output drive circuitry in second stage amplifier 216. As discussed above, the maximum magnitude of $I_{dpt\_example2}$ determines whether the source to top gate of JFET 218 remains forward biased to thereby form a low resistance path between inputs 206 and 210.

In this specific example with unity gain follower 200, a low resistance path, before output 208 has had time to equalize its voltage with input 210, means that $S_{lowexample2}$ (provided $S_{low\_example2}$ has a low internal resistance) will sink large amounts of current as it attempts to "drag" output 208 to its new value through the path formed between inputs 206 and 210.

$I_{dpt\_example2}$ also raises the current through balancing resistor 212 of JFET 218. Unless the maximum magnitude of $I_{dpt\_example2}$ is sufficiently limited it may cause resistor 212 to supply an unacceptably high voltage to the negative input of second stage amplifier 216.

Figure 3:
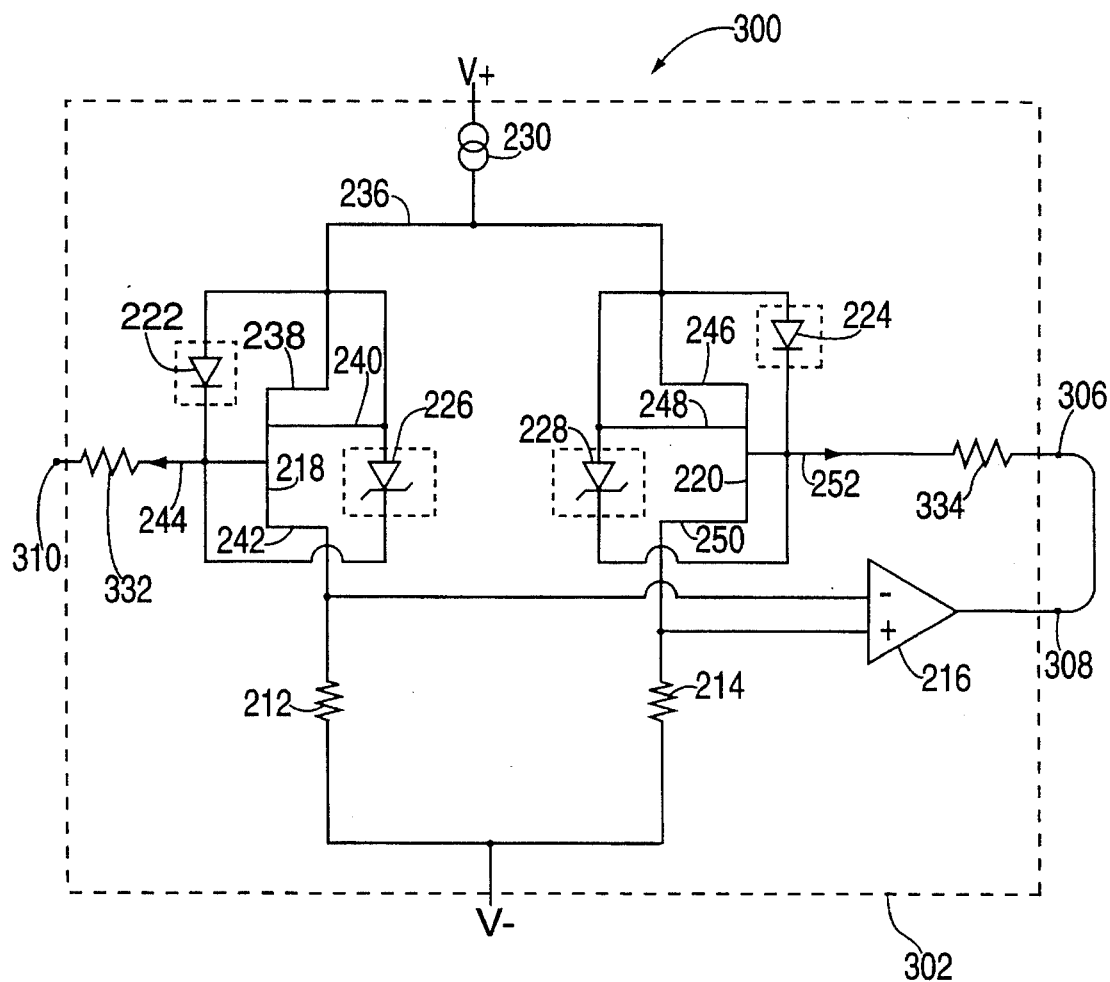
FIG. 3 is a schematic diagram with a second embodiment of an operational amplifier, connected in a unity gain follower configuration, which incorporates the principles of the present invention.

Further improvement in performance is provided by a second embodiment of the invention which adds a resistor in series with each top gate input of the opamp. The second embodiment of the invention is shown in FIG. 3, in which opamp 302 includes components shown and described with respect to FIG. 2. For clarity, all components of opamp 302 having reference numbers in the form 2XX (where each X represents a decimal digit) are considered to be substantially identical to the parts having like numbers in FIG. 2. Opamp 302 includes resistors 332 and 334 connected in series with the top gates of, respectively, JFETs 218 and 220. These resistors can be used in two ways: (i) to limit the maximum magnitude of $I_{dpt}$, and (ii) to increase the resistance of the current path which may be formed between the opamp's inputs.

Other than the addition of resistors 332 and 334, opamp 302 is the same as opamp 202. Inputs 310 and 306 form, respectively, the positive and negative inputs of opamp 202. Unity gain configuration 300 is formed by connecting input 306 to opamp 302's output 308.

Typically, to improve dynamic performance, the resistors are chosen to provide a maximum $I_{dpt}$ in the $I_{dpt1}$ range. However, even with a current path between the opamp's inputs, the resistors can be chosen to limit current between the inputs to an acceptable level. In the case of a unity gain follower, for example, the resistors could be chosen to prevent the "dragging" by the follower's input from substantially effecting the follower's output.

In addition, the resistors can be chosen to limit the maximum $I_{dpt}$ such that the maximum current through the low-input JFET's balancing resistor develops a voltage drop which is within an acceptable range for the opamp's second stage amplifier 216.

With the second embodiment of the present invention, the voltage noise of resistors 332 and 334 is added without attenuation to the voltage noise of the opamp's inputs.

Every resistive component acts as voltage noise signal source. The voltage noise of resistors 332 and 334 of the present invention will generate a proportional current noise at the drains of, respectively, 218 and 220 wherein the magnitude of the current noise at each drain will be determined by the transfer characteristic ($g_m$) at each top gate.

Figure 4:
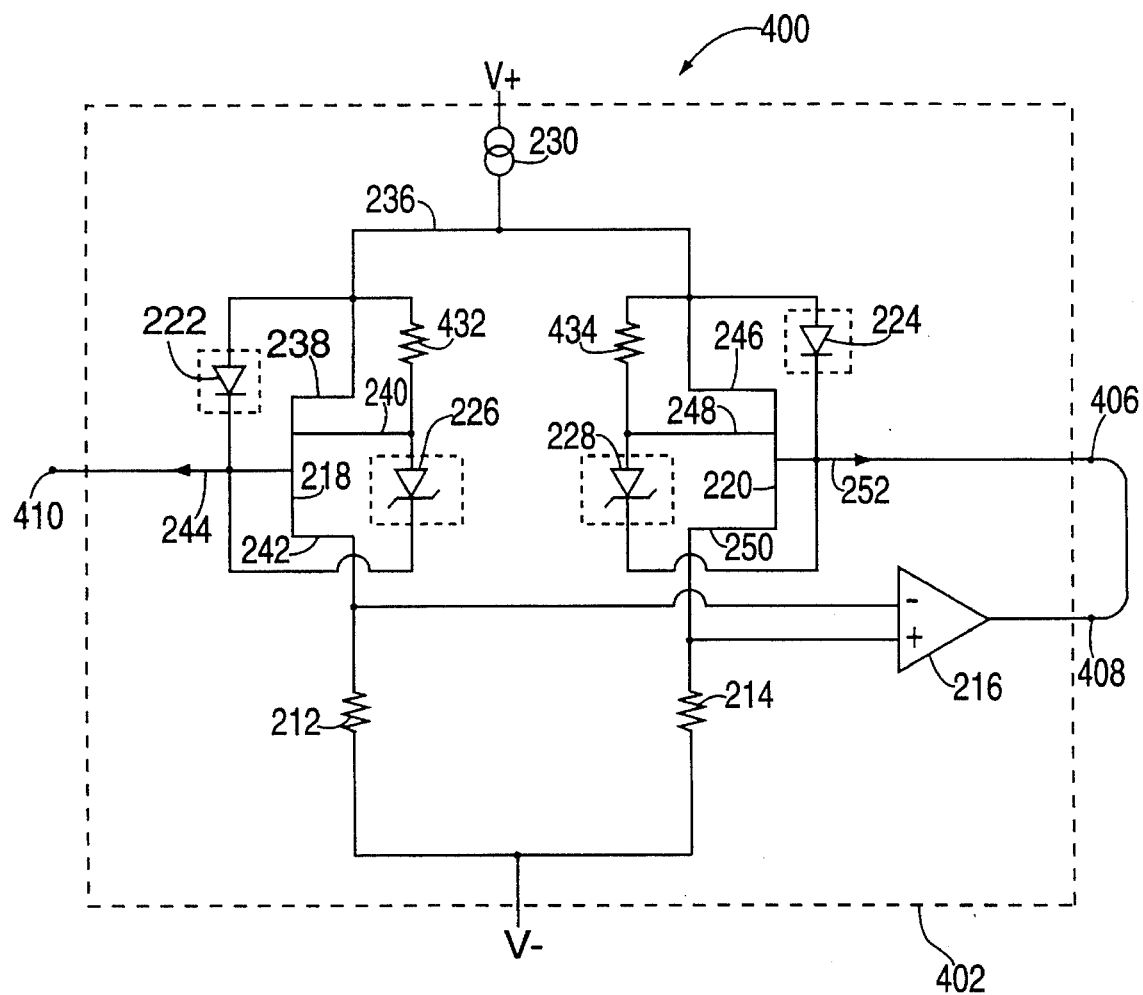
FIG. 4 is a schematic diagram with a third embodiment of an operational amplifier, connected in a unity gain follower configuration, which incorporates the principles for practising the preferred embodiment present invention.

A preferred embodiment of the invention, in which a resistor is connected between each bottom gate and the common source node, is shown in FIG. 4. Opamp 402 includes resistors 432 and 434 connected between the bottom gate and the common source of, respectively, JFETs 218 and 220. The preferred embodiment of the invention, as shown in opamp 402, includes components shown and described with respect to FIG. 2. For clarity, all components of opamp 402 having reference numbers in the form 2XX (where each X represents a decimal digit) are considered to be substantially identical to the parts having like numbers in FIG. 2.

Other than the addition of resistors 432 and 434, opamp 402 is the same as opamp 202. Inputs 410 and 406 form, respectively, the positive and negative inputs of opamp 402. Unity gain configuration 400 is formed by connecting input 406 to opamp 402's output 408.

The equivalent voltage noise at the opamp's inputs 210 and 206 introduced, respectively, by the voltage noise of resistors 432 and 434, is the amount of voltage noise which would need to have been applied to the JFETs' top gates to produce the same current noise which resistors 432 and 434 produce at the drains of the JFETs. For integrated circuit JFETs it is typically the case that the bottom gate has a $g_m$ which is substantially less than the $g_m$ of the top gate. Since the $g_m$ of the top gate is substantially greater than the $g_m$ of the bottom gate, the equivalent voltage noise introduced to the opamp's inputs by resistors 432 and 434 is greatly attenuated.

As in the second embodiment, resistors 432 and 434 are chosen to select a maximum $I_{dpt}$ with a magnitude in the ranges of $I_{dpt1}$ or $I_{dpts}$. Typically, the resistance is chosen to select an $I_{dpt}$ within the $I_{dpt1}$ range so that the common source node can slew the capacitance of the bottom gates quickly.

Also as in the second embodiment, the resistors can be chosen to limit the current, through the current path which may be formed between the inputs, to an acceptable level. In the case of a unity gain follower, as described above, the resistors could be chosen to prevent the "dragging" by the follower's input from substantially effecting the follower's output.

In addition, the resistors can be chosen to limit the maximum $I_{dpt}$ such that the maximum current through the low-input JFET's balancing resistor develops a voltage drop which is within an acceptable range for the opamp's second stage.

FIG. 5 depicts the signal response to an input square wave 502 which was applied to a simulation of unity gain follower 200 of FIG. 2. The output of the simulation (at node 208), in response to input 502, is waveform 504. The input square wave begins rising from −10 volts at 0 seconds, and reaches +10 volts at about 0.2 microseconds (us). At Time=10 us, the square wave begins falling from +10 volts to −10 volts, and reaches −10 volts at about 10.2 us. Square wave 502 then stays at −10 volts until Time=20 us. Since one period of the square wave is 20 us, it corresponds to a frequency of 50 kilohertz (kHz).

The square wave of FIG. 5, which was applied to input 210, was modeled as being supplied by a signal source whose internal resistance is low enough such that $I_{dpt}$ is in the $I_{dpt1}$ range. Output 208 of opamp 202 is also modeled as providing an $I_{dpt}$ in the $I_{dpt1}$ range. Discontinuities 506 and 508 are believed to be a result of the two problems discussed above with respect to the first embodiment of the invention: (i) $I_{dpt}$ may be so large that it causes an unacceptably high voltage to be applied to second stage 216, and (ii) a low resistance path between inputs 210 and 206 allows the follower's input 210 to drag output node 204.

Figure 6:
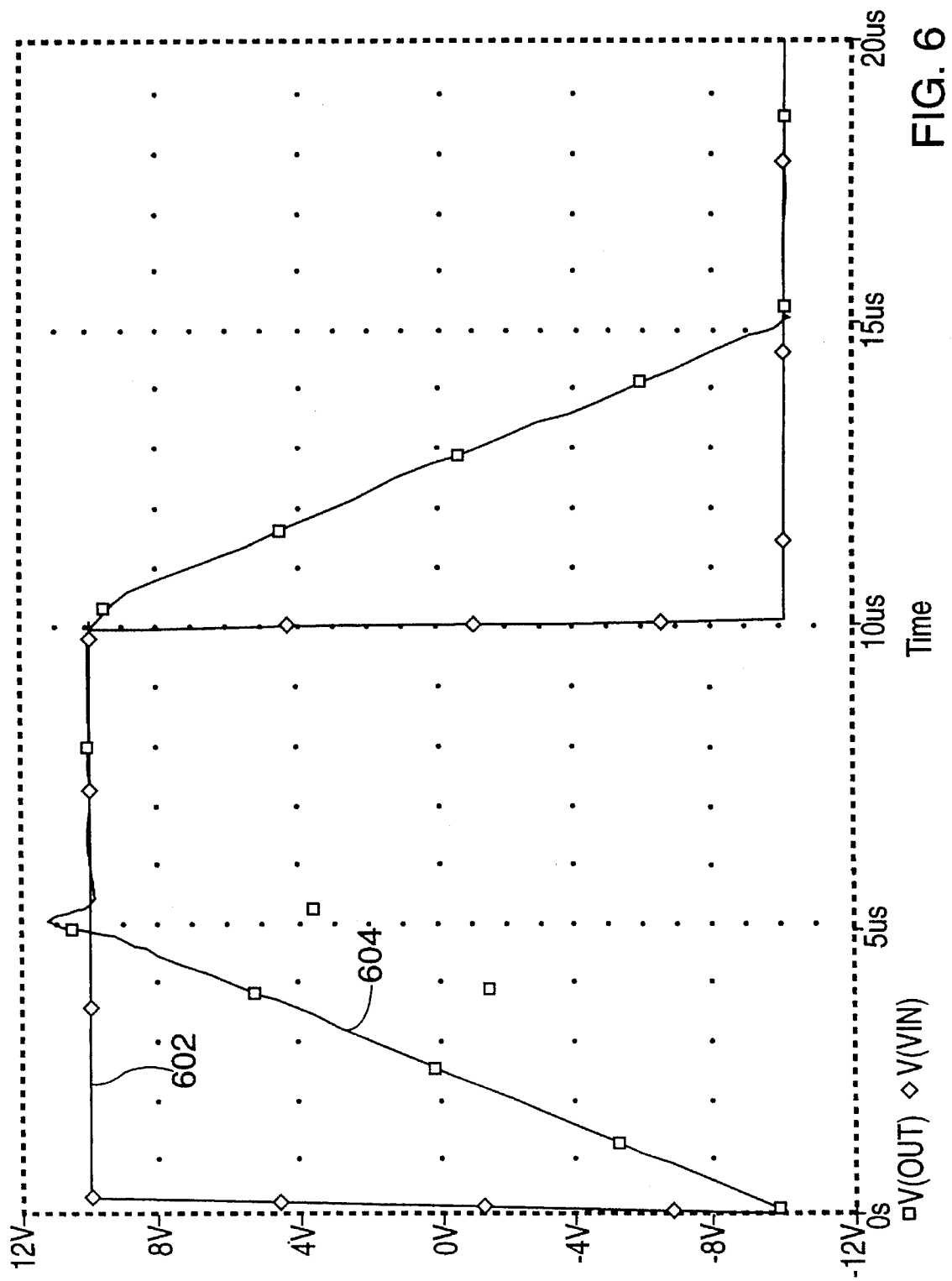
FIG. 6 is a graph which shows the results of a simulation of the unity gain follower circuit of FIG. 4.

FIG. 6 depicts an input square wave 602 which was applied to a simulation of unity gain follower 400. The output of the simulation (at node 408), in response to input 602, is waveform 604. Input square wave 602 is the same as square wave 502. As with input 502, input 602 is modeled as being supplied by a signal source whose internal resistance is in the low enough such that $I_{dpt}$ is in the $I_{dpt1}$ range. As with output 208, output 408 of opamp 402 is modeled as providing an $I_{dpt}$ in the $I_{dpt1}$ range. Because of resistors 432 and 434, however, discontinuities in output 604 (corresponding to discontinuities 506 and 508 of 504) are absent.

It is believed that resistors 432 and 434 address the problems discussed above with respect to unity gain follower 200 because: (i) the maximum magnitude of $I_{dpt}$ is limited such that an unacceptably high voltage is not applied to second stage 416, and (ii) the current between inputs 410 and 406 is limited so that input 410 does not substantially effect the output voltage.

To further illustrate the relative advantages of the three embodiments of the present invention, with respect to the total voltage noise referred to the opamp's differential inputs, a voltage noise formula for each of the described embodiments is presented. The formulas presented exclude the additional voltage noise due to balancing resistor 212, balancing resistor 214 and second stage 216. A voltage noise value for each of the three embodiments, under the same example set of operating conditions, is calculated.

The equation for the voltage noise, referred to the differential inputs of opamp 202, is derived as follows.

The wide band JFET voltage noise ($vnoise_{tg}$) which is a function of the $g_m$ of the top gate, when referred to the input to the top gate, is calculated as $$vnoise_{tg} = \left( 4KT \cdot \frac{2}{3} \cdot \frac{1}{g_{mtg}} \right)^{1/2} \quad (4)$$

Where K is the Boltzmann constant (1.38×10⁻²³ J/K), T is temperature in Kelvin, and $g_{mtg}$ is the $g_m$ of the top gate by itself.

Each differential input transistor 218 and 220 has its own value of $vnoise_{tg}$ which shall be referred to, respectively, as $vnoise_{tg218}$ and $vnoise_{tg220}$. $Vnoise_{tg218}$ is calculated with equation (4) by using the $g_m$ for the top gate of JFET 218 ($g_{mtg218}$) as the value for $g_{mtg}$. Likewise, $vnoise_{tg220}$ is calculated with equation (4) by using the $g_m$ for the top gate of JFET 220 ($g_{mtg220}$) as the value for $g_{mtg}$.

The wide band JFET voltage noise ($vnoise_{bg}$) which is a function of the $g_m$ of the bottom gate, when referred to the input to the bottom gate, is calculated as:

$$vnoise_{bg} = \left( 4KT \cdot \frac{2}{3} \cdot \frac{1}{g_{mbg}} \right)^{1/2} \quad (5)$$

Where $g_{mbg}$ is the $g_m$ of the bottom gate by itself. $Vnoise_{bg}$, when referred to the input to the top gate, is attenuated by the ratio of $g_{mbg}$ to $g_{mtg}$. Each differential input transistor 218 and 220 has its own value of $vnoise_{bg}$ which shall be referred to, respectively, as $vnoise_{bg218}$ and $vnoise_{bg220}$. $vnoise_{bg218}$ is calculated with equation (5) by using the $g_m$ for the bottom gate of JFET 218 ($g_{mbg218}$) as the value for $g_{mbg}$. Likewise, $vnoise_{tg220}$ is calculated with equation (5) by using the $g_m$ for the bottom gate of JFET 220 ($g_{mbg220}$) as the value for $g_{mbg}$.

The total voltage noise referred to the differential inputs (which is also the total voltage noise referred to the top gates of JFETs 218 and 220) of opamp 202 ($vnoise_{220}$) is the root-mean-square (RMS) sum of $vnoise_{tg218}$, $vnoise_{tg220}$, $vnoise_{bg218}$, and $vnoise_{bg220}$. The RMS sum is taken because all four of these noise sources are uncorrelated. Because $vnoise_{220}$ represents the noise referred to the top gates of JFETs 218 and 220, $vnoise_{bg218}$ and $vnoise_{bg220}$ are attenuated: $vnoise_{bg218}$ is attenuated by the ratio of $g_{mbg218}$ to $g_{mtg218}$, and $vnoise_{bg220}$ is attenuated by the ratio of $g_{mbg220}$ to $g_{mtg220}$. The RMS sum is calculated as follows:

$$vnoise_{202} = \Big[\, vnoise_{tg218}^2 + vnoise_{tg220}^2 + \quad (6)$$

$$\left. \left( \text{vnoise}_{bg218} \cdot \left( \frac{g_{mbg218}}{g_{mtg218}} \right) \right)^2 + \left( \text{vnoise}_{bg220} \cdot \left( \frac{g_{mbg220}}{g_{mtg220}} \right) \right)^2 \right]^{1/2}$$

The equation for the voltage noise referred to the differential inputs of opamp 302 is derived as follows.

The voltage noise for a resistor is calculated as follows:

$$\text{vnoise}_R = (4KT \cdot R)^{1/2} \quad (7)$$

Where R is the resistance of the resistor in ohms.

The voltage noise for resistor 332 ($\text{vnoise}_{R332}$) is found by using the resistance of resistor 332 in equation (7). Likewise, the voltage noise for resistor 334 ($\text{vnoise}_{R334}$) is found by using the resistance of resistor 334 in equation (7).

The total voltage noise referred to the differential inputs of opamp 302 ($\text{vnoise}_{302}$) is the RMS of the following voltage noise sources, all of which are uncorrelated:

$$\text{vnoise}_{302} = \left[ \text{vnoise}_{tg218}^2 + \text{vnoise}_{tg220}^2 + \right. \quad (8)$$

$$\left( \text{vnoise}_{bg218} \cdot \left( \frac{g_{mbg218}}{g_{mtg218}} \right) \right)^2 + \left( \text{vnoise}_{bg220} \cdot \left( \frac{g_{mbg220}}{g_{mtg220}} \right) \right)^2$$

$$\left. + \text{vnoise}_{R332}^2 + \text{vnoise}_{R334}^2 \right]^{1/2}$$

As can be seen from equation (8), the voltage noise contributions from resistors 332 and 334 are added, unattenuated, to the RMS sum.

The equation for the voltage noise, at the differential inputs of opamp 402, is derived as follows.

Using equation (7), the voltage noise for resistor 432 ($\text{vnoise}_{R432}$) and the voltage noise for resistor 434 ($\text{vnoise}_{R434}$) is calculated. As with $\text{vnoise}_{bg218}$ and $\text{vnoise}_{bg220}$, $\text{vnoise}_{R432}$ and $\text{vnoise}_{R434}$ are attenuated when referred to the top gates of, respectively, JFETs 218 and 220. Specifically, $\text{vnoise}_{R432}$ is attenuated by the ratio of $g_{mbg218}$ to $g_{mtg218}$, and $\text{vnoise}_{R434}$ is attenuated by the ratio of $g_{mbg220}$ to $g_{mtg220}$.

The total voltage noise referred to the differential inputs of opamp 402 ($\text{vnoise}_{402}$) is the RMS of the following voltage noise sources, all of which are uncorrelated:

$$\text{vnoise}_{402} = \left[ \text{vnoise}_{tg218}^2 + \text{vnoise}_{tg220}^2 + \right. \quad (9)$$

$$\left( \text{vnoise}_{bg218} \cdot \left( \frac{g_{mbg218}}{g_{mtg218}} \right) \right)^2 + \left( \text{vnoise}_{bg220} \cdot \left( \frac{g_{mbg220}}{g_{mtg220}} \right) \right)^2 +$$

$$\left. \left( \text{vnoise}_{R432} \cdot \left( \frac{g_{mbg218}}{g_{mtg218}} \right) \right)^2 + \left( \text{vnoise}_{R434} \cdot \left( \frac{g_{mbg220}}{g_{mtg220}} \right) \right)^2 \right]^{1/2}$$

$\text{Vnoise}_{202}$, $\text{vnoise}_{302}$ and $\text{vnoise}_{402}$ are calculated, for an exemplary set of circuit parameters, as follows.

The following calculations of $\text{vnoise}_{202}$, $\text{vnoise}_{302}$ or $\text{vnoise}_{402}$ are based upon actual measurements of a PJFET which is referred to as PJFET 700. Several values of $I_{DSS}$ and $V_p$ of PJFET 700 were measured, and these measurements were then utilized to calculate, at a particular quiescent point, the $g_{mtgbg}$ (where $g_{mtgbg}$ is the $g_m$ of PJFET 700 when both the top gate and the bottom gate are used as inputs), $g_{mtg}$ and $g_{mbg}$.

Figure 7A:
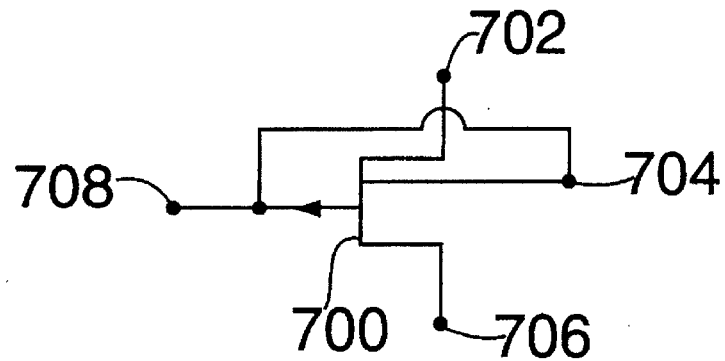
FIGS. 7A, 7B and 7C depict circuit configurations used to make measurements of a PJFET.
Figure 7B:
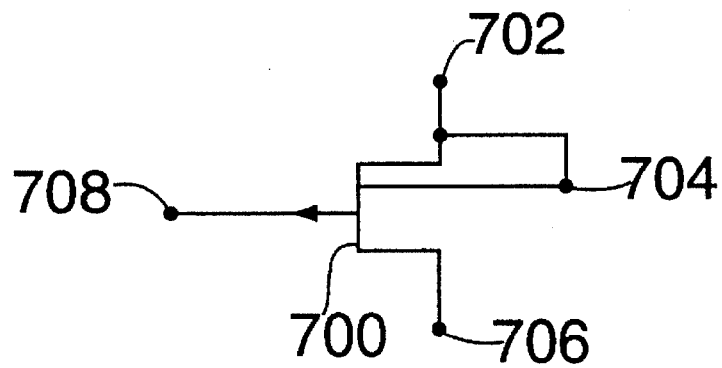
Figure 7C:
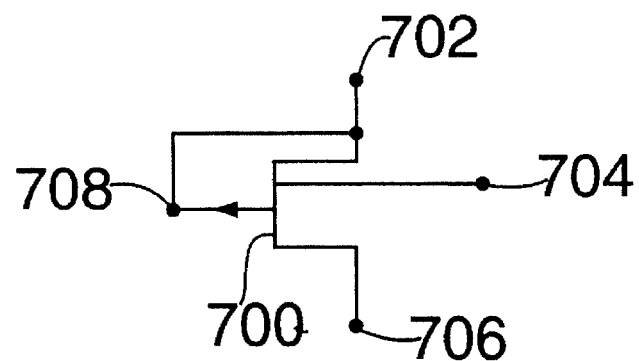

The circuit configurations used to make the measurements of PJFET 700 are shown in FIGS. 7A–7C. In FIGS. 7A–7C, 702 is the source terminal, 706 is the drain terminal, 704 is the bottom gate terminal and 708 is the top gate terminal. In FIG. 7A, top gate terminal 708 is connected to bottom gate terminal 704. The connection of the top gate to the bottom gate permits the circuit of FIG. 7A to be used to make the measurements of PJFET 700 from which a value of $g_{mtgbg}$ is calculated. In FIG. 7B, source terminal 702 is connected to bottom gate 704. The connection of the source to the bottom gate permits the circuit of FIG. 7B to be used to make the measurements of PJFET 700 from which a value of $g_{mtg}$ is calculated. In FIG. 7C, source terminal 702 is connected to top gate terminal 708. The connection of the source to the top gate permits the circuit of FIG. 7C to be used to make the measurements of PJFET 700 from which a value of $g_{mbg}$ is calculated.

For each of the circuits depicted in FIGS. 7A to 7C, an $I_{DSS}$ and Vp was measured. These values are shown in FIG. 8. Using the measured values of $I_{DSS}$ and Vp, the for each of the circuits of FIGS. 7A–7C was calculated. Each value of calculated is listed in FIG. 8.

A quiescent point of $I_D$=400 µA was used for each of FIGS. 7A–7C as being a typical operating point for PJFET 700 when utilized to implement the differential input pair for each of opamps 202, 302 and 402.

From the calculated value for and the chosen value for $I_D$, $g_{mtgbg}$ was calculated for the circuit of FIG. 7A (and is listed in FIG. 8 under the $g_m$ column at the FIG. 7A row). From the calculated value for and the chosen value for $I_D$, $g_{mtg}$ was calculated for the circuit of FIG. 7B (and is listed in FIG. 8 under the $g_m$ column at the FIG. 7B row). From the calculated value for and the chosen value for $I_D$, $g_{mbg}$ was calculated for the circuit of FIG. 7C (and is listed in FIG. 8 under the $g_m$ column at the FIG. 7C row).

Figure 9A:
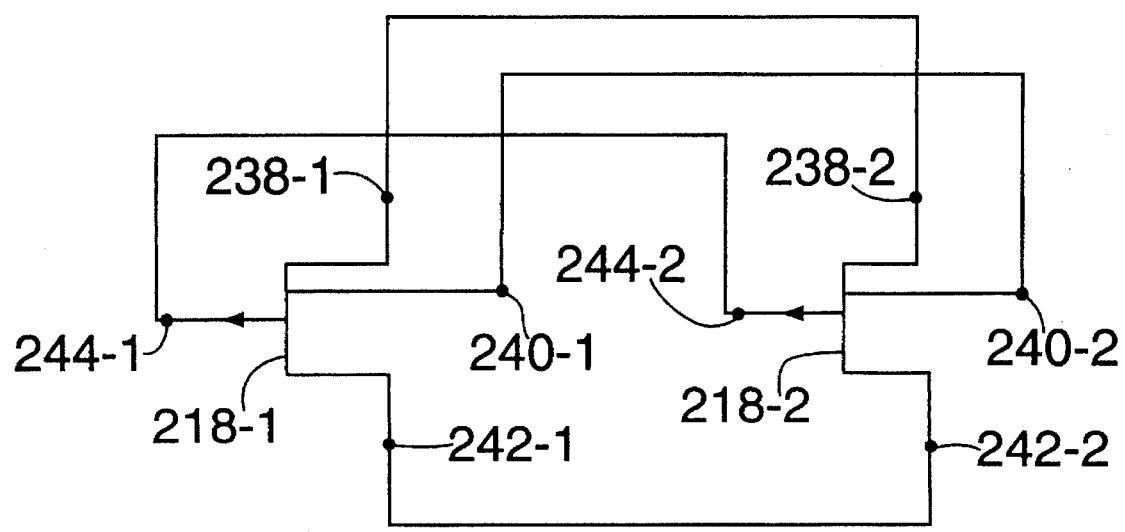
FIG. 9A depicts a parallel connection of two sub-JFETs utilized to implement a single differential input JFET.

Typically, each of JFETs 218 and 220 is implemented by two sub-JFETs connected in parallel. The sub-JFETs of JFET 218 are called JFET 218-1 and 218-2, while the sub-JFETs of JFET 220 are called JFET 220-1 and 220-2. FIG. 9A depicts the parallel connection of the two sub-JFETs which implement JFET 218. Sub-JFET 218-1 has source terminal 238-1, drain terminal 242-1, top gate terminal 244-1 and bottom gate terminal 240-1. Sub-JFET 218-2 has source terminal 238-2 (which is connected to source terminal 238-1), drain terminal 242-2 (which is connected to drain terminal 242-1), top gate terminal 244-2 (which is connected to top gate terminal 244-1) and bottom gate terminal 240-2 (which is connected to bottom gate terminal 240-1).

Figure 9B:
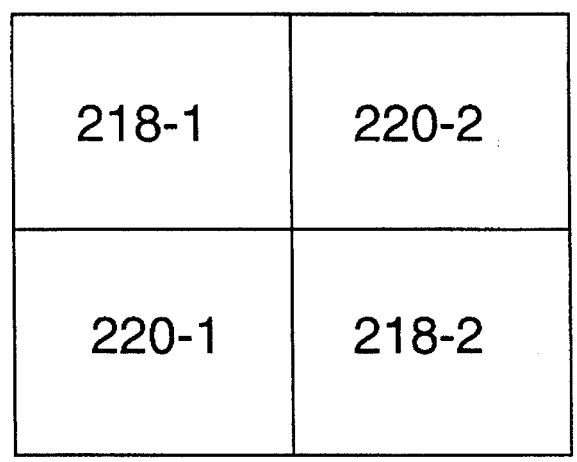
FIG. 9B depicts a layout pattern for sub-JFETs for an integrated circuit implementation of differential input JFETs.

Typically, sub-JFETs 218-1, 218-2, 220-1 and 220-2 are located, on an integrated circuit chip, according to a "cross coupled" layout pattern as is depicted in FIG. 9B. This placement of the sub-JFETs helps to balance changes in electrical parameters due to the effects of heating and also due to the piezo effects which result from die stress.

For the purposes of the example noise calculations below, for opamps 202, 302 and 402, it is assumed that each of sub-JFETs 218-1, 218-2, 220-1 and 220-1 has the same electrical characteristics as PJFET 700 and that each sub-JFET is operating at the same typical quiescent point of $I_D$=400 µA. It is reasonable to estimate all the sub-JFETs as operating at the same typical quiescent point since JFETs 218 and 220 are operating under similar biasing conditions in opamps 202, 302 and 402.

The parallel connection of two sub-JFETs, of the type of PJFET 700, means that each of JFETs 218 and 220 has values for $I_{DSS}$ and $I_D$ which are two times the magnitudes listed in FIG. 8. It can be seen from equations (2) and (3) that doubling the magnitude of $I_{DSS}$ and $I_D$ results in doubling the magnitude of each value of and $g_m$ shown in FIG. 8.

The formulas for vnoise202, vnoise302 and $\text{vnoise}_{402}$ are calculated with the following values: $4KT=1.66\times10^{-20}$ $g_{mtg218}=g_{mtg220}=194$ mmho (where mho means units of conductance and mmho means units of $1\times10^{-3}$ mho), $g_{mbg218}=g_{mbg220}=0.44$ mmho, resistor 332 being $10^4$ ohms, resistor 334 being $10^4$ ohms, resistor 432 being $10^4$ ohms, and resistor 434 being $10^4$ ohms.

From the above values, formulas (4), (5) and (7) were evaluated to produce the following approximate values: $vnoise_{tg218}=vnoise_{tg220}=2\times10^{-9}$ V/rtHz, $vnoise_{bg218}=vnoise_{bg220}=5\times10^{-9}$ V/rtHz, $(g_{mbg218}/g_{mtg218})=(g_{mbg220}/g_{mtg220})=0.2268$, $vnoise_{R332}=vnoise_{R334}=vnoise_{R432}=vnoise_{R434}=12\times10^{-9}$ V/rtHz.

From the above values, $vnoise_{202}$ is calculated from equation (6) to be an approximate value of $3\times10^{-9}$ V/rtHz, $vnoise_{302}$ is calculated from equation (8) to be an approximate value of $17\times10^{-9}$ V/rtHz, and $vnoise_{402}$ is calculated from equation (9) to be an approximate value of $5\times10^{-9}$ V/rtHz. As is observed from these values for $vnoise_{202}$, $vnoise_{302}$ and $vnoise_{402}$, opamp 402 is the preferred embodiment since it has both the punch through current limiting of opamp 302 and a low voltage noise as found in opamp 202.

While preferred embodiments of the invention have been set forth for purposes of the disclosure, modification of these embodiments may occur to those skilled in the art. For example, the opamps described above may be implemented with NJFETs rather than the PJFETs presented herein. Persons skilled in the art will appreciate that the present invention can be practiced by other than the described embodiments, which are presented for purposes of illustration and not of limitation, and that the present invention is limited only by the claims which follow.

What is claimed is:

1. An operational amplifier circuit having first and second differential inputs and an output, the operational amplifier circuit comprising:

a first junction field effect transistor having a first top gate terminal coupled to the first differential input, a first bottom gate terminal, a first drain terminal, and a first source terminal coupled to the first bottom gate terminal;

a second junction field effect transistor having a second top gate terminal coupled to the second differential input, a second bottom gate terminal, a second drain terminal, and a second source terminal coupled to the second bottom gate terminal;

a current source coupled to the first and second source terminals; and a second stage amplifier having a first input coupled to the first drain terminal, a second input coupled to the second drain terminal and an output coupled to the output of the operational amplifier.

2. The operational amplifier of claim 1, further comprising:

a first balancing load;

a second balancing load;

the first drain terminal being coupled to the first balancing load; and the second drain terminal being coupled to the second balancing load.

3. The operational amplifier of claim 1, further comprising:

a first current limiting circuit having a first terminal and a second terminal;

a second current limiting circuit having a first terminal and a second terminal;

the first terminal of the first current limiting circuit being coupled to the first differential input and the second terminal of the first current limiting circuit being coupled to the first top gate terminal; and the first terminal of the second current limiting circuit being coupled to the second differential input and the second terminal of the second current limiting circuit being coupled to the second top gate terminal.

4. The operational amplifier of claim 3, wherein:

the first current limiting circuit comprises a first resistor; and the second current limiting circuit comprises a second resistor.

5. The operational amplifier of claim 4, further comprising:

a first balancing load;

a second balancing load;

the first drain terminal being coupled to the first balancing load; and the second drain terminal being coupled to the second balancing load.

6. The operational amplifier of claim 1, further comprising:

a first current limiting circuit having a first terminal and a second terminal;

a second current limiting circuit having a first terminal and a second terminal;

the first terminal of the first current limiting circuit being coupled to the first source terminal and the second terminal of the first current limiting circuit being coupled to the first bottom gate terminal; and the first terminal of the second current limiting circuit being coupled to the second source and the second terminal of the second current limiting circuit being coupled to the second bottom gate terminal.

7. The operational amplifier of claim 6, further comprising:

a first balancing load;

a second balancing load;

the first drain terminal being coupled to the first balancing load; and the second drain terminal being coupled to the second balancing load.

8. The operational amplifier of claim 6, wherein:

the first current limiting circuit comprises a first resistor; and the second current limiting circuit comprises a second resistor.

9. The operational amplifier of claim 8, further comprising:

a first balancing load;

a second balancing load;

the first drain terminal being coupled to the first balancing load; and the second drain terminal being coupled to the second balancing load.

10. An amplifier circuit having first and second inputs and an output, comprising:

a first junction field effect transistor (JFET) having a top gate, a bottom gate, a source and a drain;

a second junction field effect transistor (JFET) having a top gate, a bottom gate, a source and a drain;

a current source;

a first balancing load;

a second balancing load;

a second stage amplifier having a first input, a second input and an output;

the first input of the amplifier circuit being coupled to the top gate of the first JFET;

the second input of the amplifier circuit being coupled to the top gate of the second JFET;

the source and the bottom gate of the first JFET being coupled to the current source;

the source and the bottom gate of the second JFET being coupled to the current source;

the drain of the first JFET being coupled to both the first input of the second stage amplifier and to the first balancing load;

the drain of the second JFET being coupled to both the second input of the second stage amplifier and to the second balancing load; and the output of the second stage amplifier being coupled to the output of the amplifier circuit.

11. An amplifier circuit having first and second inputs and an output, comprising:

a first junction field effect transistor (JFET) having a top gate, a bottom gate, a source and a drain; a second junction field effect transistor (JFET) having a top gate, a bottom gate, a source and a drain;

a current source;

a first balancing load;

a second balancing load;

a second stage amplifier having a first input, a second input and an output;

a first resistor having a first terminal and a second terminal;

a second resistor having a first terminal and a second terminal;

the first input of the amplifier circuit being coupled to the first terminal of the first resistor and the second terminal of the first resistor being coupled to the top gate of the first JFET;

the second input of the amplifier circuit being coupled to the first terminal of the second resistor and the second terminal of the second resistor being coupled to the top gate of the second JFET;

the source and the bottom gate of the first JFET being coupled to the current source;

the source and the bottom gate of the second JFET being coupled to the current source;

the drain of the first JFET being coupled to both the first input of the second stage amplifier and the first balancing load;

the drain of the second JFET being coupled to both the second input of the second stage amplifier and the second balancing load; and the output of the second stage amplifier being coupled to the output of the amplifier circuit.

12. An amplifier circuit having first and second inputs and an output, comprising:

a first junction field effect transistor (JFET) having a top gate, a bottom gate, a source and a drain;

a second junction field effect transistor (JFET) having a top gate, a bottom gate, a source and a drain;

a current source;

a first balancing load;

a second balancing load;

a second stage amplifier having a first input, a second input and an output;

a first resistor having a first terminal and a second terminal;

a second resistor having a first terminal and a second terminal;

the first input of the amplifier circuit being coupled to the top gate of the first JFET;

the second input of the amplifier circuit being coupled to the top gate of the second JFET;

the source of the first JFET being coupled to the current source;

the bottom gate of the first JFET being coupled to the first terminal of the first resistor and the second terminal of the first resistor being coupled to the current source;

the source of the second JFET being coupled to the current source;

the bottom gate of the second JFET being coupled to the first terminal of the second resistor and the second terminal of the second resistor being coupled to the current source;

the drain of the first JFET being coupled to both the first input of the second stage amplifier and the first balancing load;

the drain of the second JFET being coupled to both the second input of the second stage amplifier and the second balancing load; and the output of the second stage amplifier being coupled to the output of the amplifier circuit.

13. A method for preventing punch through in an operational amplifier having a first differential input, a second differential input and an output, the method comprising the steps of:

applying a first input voltage to the first differential input;

applying a second input voltage to the second differential input;

applying a tail current, from a tail current source, to a common source node;

applying the first input voltage of the first differential input to a first top gate terminal of a first junction field effect transistor (JFET), wherein the first JFET has a first punch through voltage;

applying the second input voltage of the second differential input to a second top gate terminal of a second junction field effect transistor (JFET), wherein the second JFET has a second punch through voltage;

sinking the tail current, through a first source terminal of the first JFET and through a second source terminal of the second JFET, to produce a common source node voltage;

generating a common source node voltage, when the first input voltage is within a first voltage range of the second input voltage, wherein the difference between the common source node voltage and the first input voltage is less than the first punch through voltage of the first JFET and the difference between the common source node voltage and the second input voltage is less than the second punch through voltage of the second JFET;

applying the common source node voltage to a first bottom gate terminal of the first JFET; and applying the common source node voltage to a second bottom gate terminal of the second JFET.

14. The method of claim 13, further comprising:

limiting a first punch through current through the first JFET, when the first input voltage is not within the first voltage range of the second input voltage, with a current limiting circuit coupled between the first differential input and the first top gate terminal.

15. The method of claim 13, further comprising:

limiting a first punch through current through the first JFET, when the first input voltage is not within the first voltage range of the second input voltage, with a current limiting circuit coupled between the first source terminal and the first bottom gate terminal.

16. An operational amplifier circuit having first and second differential inputs and an output, the operational amplifier circuit comprising:

a first junction field effect transistor (JFET) having a first top gate terminal coupled to the first differential input, a first bottom gate terminal, a first drain terminal, and a first source terminal coupled to the first bottom gate terminal;

the first JFET having a first punch through voltage;

a second junction field effect transistor (JFET) having a second top gate terminal coupled to the second differential input, a second bottom gate terminal, a second drain terminal, and a second source terminal coupled to the second bottom gate terminal;

the second JFET having a second punch through voltage;

a current source coupled to a common source node;

the common source node being coupled to the first and second source terminals;

a second stage amplifier having a first input coupled to the first drain terminal, a second input coupled to the second drain terminal and an output coupled to the output of the operational amplifier; and the common source node having a common source node voltage, when a first input voltage applied to the first differential input is within a first voltage range of a second input voltage applied to the second differential input, wherein the difference between the common source node voltage and the first input voltage is less than the first punch through voltage and the difference between the common source node voltage and the second input voltage is less than the second punch through voltage.

17. The operational amplifier of claim 16, further comprising:

a first current limiting circuit having a first terminal and a second terminal;

a second current limiting circuit having a first terminal and a second terminal;

the first terminal of the first current limiting circuit being coupled to the first differential input and the second terminal of the first current limiting circuit being coupled to the first top gate terminal; and the first terminal of the second current limiting circuit being coupled to the second differential input and the second terminal of the second current limiting circuit being coupled to the second top gate terminal.

18. The operational amplifier of claim 17, further comprising:

a signal source, providing a driving signal voltage, coupled to the second differential input; and wherein the first current limiting circuit limits a forward bias current from the source terminal to top gate terminal of the second JFET to within a current range, when a punch through current is flowing from the top gate terminal to the bottom gate terminal of the first JFET, wherein the driving signal voltage is substantially unchanged by the forward bias current.

19. The operational amplifier of claim 17, further comprising:

a first balancing load;

a second balancing load;

the first drain terminal being coupled to the first balancing load; and the second drain terminal being coupled to the second balancing load.

20. The operational amplifier of claim 19, wherein the first current limiting circuit limits a first punch through current through the first JFET to being within a current range wherein a voltage developed across the second balancing load is limited to being within an acceptable range for the second input to the second stage amplifier.

21. The operational amplifier of claim 16, further comprising:

a first current limiting circuit having a first terminal and a second terminal;

a second current limiting circuit having a first terminal and a second terminal;

the first terminal of the first current limiting circuit being coupled to the first source terminal and the second terminal of the first current limiting circuit being coupled to the first bottom gate terminal; and the first terminal of the second current limiting circuit being coupled to the second source and the second terminal of the second current limiting circuit being coupled to the second bottom gate terminal.

22. The operational amplifier of claim 21, further comprising:

a signal source, providing a driving signal voltage, coupled to the second differential input; and wherein the first current limiting circuit limits a forward bias current from the source terminal to top gate terminal of the second JFET to within a current range, when a punch through current is flowing from the top gate terminal to the bottom gate terminal of the first JFET, wherein the driving signal voltage is substantially unchanged by the forward bias current.

23. The operational amplifier of claim 21, further comprising:

a first balancing load;

a second balancing load;

the first drain terminal being coupled to the first balancing load; and the second drain terminal being coupled to the second balancing load.

24. The operational amplifier of claim 23, wherein the first current limiting circuit limits a first punch through current through the first JFET to being within a current range wherein a voltage developed across the second balancing load is limited to being within an acceptable range for the second input to the second stage amplifier.

\* \* \* \* \*

UNITED STATES PATENT AND TRADEMARK OFFICE
CERTIFICATE OF CORRECTION

PATENT NO. : 5,537,078
DATED : July 16, 1996
INVENTOR(S) : Alexander M. Strong

It is certified that error appears in the above-identified patent and that said Letters Patent is hereby corrected as shown below:

Column 1,
Lines 31 and 32, change "designated" to -- designated as --;

Column 2,
Line 44, change "introduce" to -- introduces --;
Line 50, change "circuitry" to -- circuitry, --;

Column 3,
Line 67, change "$g_m=2\cdot (I_D\sqrt{\beta})^{½}$" to -- $g_m=2\cdot (I_D\cdot\beta)^{½}$ --;

Column 4,
Line 22, change "embodiment" to -- embodiment of the --;

Column 8,
Line 1, change "$s_{lowexample2}$" to -- $s_{low\_example2}$ --;

Column 9,
Line 63, change "is in the low" to -- is low --;

Column 10,
Line 22, change "as" to -- as : --;
Line 62, change "$g_{mbg218}$ ," to -- $g_{mtg218}$ , --;

Column 12,
Line 15, change "the for" to -- the $\beta$ for --;
Line 17, change "of calculated" to -- of $\beta$ calculated --;
Lines 22, 25 and 28, change "for and" to -- for $\beta$ and --;
Line 30, change "row)   ." to -- row) . --;
Line 53, change "and 220-1" to -- and 220-2 --;
Line 65, change "of and" to -- of $\beta$ and --;
Line 67, change "$4KT=1.66x10^{-20}$" to -- $4KT=1.66x10^{-20}$, --;

UNITED STATES PATENT AND TRADEMARK OFFICE
CERTIFICATE OF CORRECTION

PATENT NO.   : 5,537,078
DATED        : July 16, 1996
INVENTOR(S)  : Alexander M. Strong It is certified that error appears in the above-identified patent and that said Letters Patent is hereby corrected as shown below:

<u>Column 13,</u>
Line 1, change "194" to -- 1.94 --;

<u>Column 15,</u>
Line 24, change "and a drain;" to -- and a drain; -- (new paragraph).

Signed and Sealed this

Twenty-second Day of October, 2002

Attest:

JAMES E. ROGAN
Attesting Officer          Director of the United States Patent and Trademark Office